US007647695B2

(12) United States Patent
MacNutt et al.

(10) Patent No.: US 7,647,695 B2
(45) Date of Patent: Jan. 19, 2010

(54) METHOD OF MATCHING HARNESSES OF CONDUCTORS WITH APERTURES IN CONNECTORS

(75) Inventors: William Phillip MacNutt, Austin, TX (US); Richard A. Malleck, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 867 days.

(21) Appl. No.: 11/149,836

(22) Filed: Jun. 10, 2005

(65) Prior Publication Data

US 2005/0235491 A1 Oct. 27, 2005

Related U.S. Application Data

(63) Continuation-in-part of application No. 10/749,056, filed on Dec. 30, 2003, now Pat. No. 7,093,351.

(51) Int. Cl.
*H05K 3/30* (2006.01)
*H01R 43/00* (2006.01)

(52) U.S. Cl. ............................ 29/837; 29/748; 29/842; 29/845

(58) Field of Classification Search .................. 29/748, 29/850, 854, 868, 842, 845, 837
See application file for complete search history.

(56) References Cited

U.S. PATENT DOCUMENTS 4,462,155 A * 7/1984 Brunelle et al. ............... 29/593
4,631,823 A 12/1986 Collier et al. ................. 29/867
4,727,637 A * 3/1988 Buckwitz et al. ......... 29/407.04
4,890,382 A 1/1990 Anderson et al. ............. 29/833
5,477,606 A * 12/1995 Igura ........................... 29/721
5,590,457 A * 1/1997 Ninchi ......................... 29/721
5,682,672 A * 11/1997 Taniguchi et al. ............. 29/748
5,987,743 A * 11/1999 Yui ............................. 29/850
6,169,934 B1 * 1/2001 Nakayama et al. .......... 700/213
6,272,387 B1 * 8/2001 Yoon ........................... 700/83
6,477,437 B1 11/2002 Hirota ......................... 700/95
2003/0163917 A1 * 9/2003 Davidshofer et al. .......... 29/854

* cited by examiner

*Primary Examiner*—C. J Arbes
(74) *Attorney, Agent, or Firm*—Bracewell & Giuliani LLP

(57) ABSTRACT

An OCR system for matching wire harnesses and connectors facilitates precise registration of wire number strings, uses geometric modeling for character recognition, and restricts searches by region and character to ensure speed and accuracy. A string location algorithm is used to search for and identify the location of the beginning of a wire number string. The horizontal edges of the wire in the image are located, a diameter of the wire is determined, light intensity is confirmed, and the first character is found. The resulting coordinate is used by the algorithm for character definition. Geometric shapes are used for identification in order to overcome twisted wires, poorly printed markings, ink color variations, and contacting characters.

9 Claims, 11 Drawing Sheets

METHOD OF MATCHING HARNESSES OF CONDUCTORS WITH APERTURES IN CONNECTORS

This Continuation-in-Part Application claims the priority of Parent application Ser. No. 10/749,056, filed on Dec. 30, 2003, now U.S. Pat. No. 7,093,351 and entitled System, Method, and Apparatus for Matching Harnesses of Conductors With Apertures in Connectors, and is incorporated herein by reference.

BACKGROUND OF THE INVENTION

1. Technical Field

The present invention relates in general to assembling complex wire harnesses and, in particular, to an improved system, method, and apparatus for assembling wire harnesses with a connector light array designator.

2. Description of the Related Art

Many different industrial applications require the termination of large bundles or harnesses of wires into various types of connectors. In some applications, such as aircraft or automotive systems, each harness may contain more than 100 wires that must be routed and terminated in dozens of connectors throughout the assembly.

In the prior art, current wire/connector matching and termination methods begin by printing engineering data that displays the wire numbers and their related pin locations in the connector. A technician moves to the pre-selected wire harness, which may be remote or difficult to access, where he or she will perform the wire pinning operation. Such pinning operations typically comprise random selection of a wire from a harness of bundled wires. As shown in FIGS. 1 and 2, once the wire 21 has been identified by its label 23, the technician reads the engineering data 25 on the wire 21 to determine a pin location 27 on the connector 29 in which the wire 21 will be inserted. Once the pin location 27 on the connector 29 has been cross-referenced on engineering data 25, the task of locating the pin location 27 within the connector 29 must be done in order to insert the wire 21.

As illustrated in FIG. 3, this operation has a number of potentially high risk sources of error, including extremely small wire diameter, a large number of wires 21 per connector, close proximity of the wires in numerous harnesses 31, and limited work space 33, which creates awkward work positions. Thus, an improved system, method, and apparatus for matching harnesses of conductors with associated ones of apertures in connectors is needed.

SUMMARY OF THE INVENTION

One embodiment of a system, method, and apparatus for improved optical character recognition (OCR) of wires in matching wire harnesses and connectors is disclosed. The present invention facilitates precise registration of wire number strings, uses geometric modeling for character recognition, and restricts searches by region and character to ensure speed and accuracy.

In typical OCR systems, an algorithm searches an entire image for the occurrence of a full string of characters. In contrast, the present invention uses a string location algorithm to search for and identify the XY location of the beginning of a wire number string. In one embodiment, this is a multi-step process that requires all steps to be successful in order to return a valid position. The steps include: (1) Locating the horizontal edges of the wire in the image. The wire typically is a light color against a black background. Edge detection is used to locate these edges. (2) Determining a diameter of the wire. The algorithm searches for a smooth, basically straight section of the wire and calculates the diameter based on a calibration value (e.g., pixels to inches). (3) Confirming light intensity. A section of the wire background is sampled and compared against a minimum value to assure that the lighting system is operating properly. (4) Finding the first character. This algorithm searches within the confines of the wire edges for a break in the background continuity. The resulting coordinate (XY) is used by the OCR algorithm for character definition.

Many standard OCR systems expect the character strings to be members of a strict font definition. Additionally, they expect the characters to be evenly spaced and well defined. The OCR algorithm of the present invention instead uses geometric shapes as a basis for identification. This is helpful because the characters on the wires are typically twisted, poorly printed, vary in ink color, and worst of all, the characters often touch each other, resulting in what looks like a "new" character.

In addition, the OCR algorithm of the present invention defines the wire number string character by character, starting with the first one identified by the above-described locate algorithm. The area is restricted to an area that surrounds the candidate character. The database is checked for all possible characters that could be in each position. Models for each possibility are then geometrically compared to the candidate. The best result is taken as the character, and the algorithm advances to the next space. This design yields a much higher confidence that the character is actually verified. It also serves to separate touching characters, since only the width of the model is used as a search field.

This OCR system may be used, for example, to assemble wire harnesses with their connectors via a compact computer-based system that is linked to an engineering database. The database contains component information, such as harness number, associated wires, and pin location to connector. Connected to the computer system is a tool that contains an LED light panel that, in turn, is linked to a dummy connector via light rods. The dummy connector has a mating end for the connector being pinned, which can be male or female.

The connector to be pinned is mated to the dummy connector and automatically clocks to a correct position that allows the pinholes in the connector to align with the light rods in the dummy connector. Once in place, the technician begins the task of selecting and placing the wires into their correct location.

Once the wire has been identified, the system then signals the appropriate light to be switched on within the LED panel in the dummy connector. The light emitted by the LED is transferred via a light rod to the appropriate pin location on the selected connector, thereby providing a visible point of light in which the selected wire is to be terminated. This process is repeated until all of the wires are pinned. These methods can be used interchangeably at any time, which gives the technician the ability to selectively toggle between methods with a push of button, depending on his or her preference.

The system can operate in very confined areas, is portable in nature, and is easily maintained. In addition, the system is easy to learn, easy to use, and virtually error free. In contrast, prior art systems are not so flexible, as they require much larger open areas (such as bench tops), and/or the attachment of a low voltage power source at the opposite end of the harness being pinned. The design of the present invention allows for it to be used by manufacturers or harness assemblers requiring much more remote and limited access, such as in the assembly of automobiles or aircraft.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
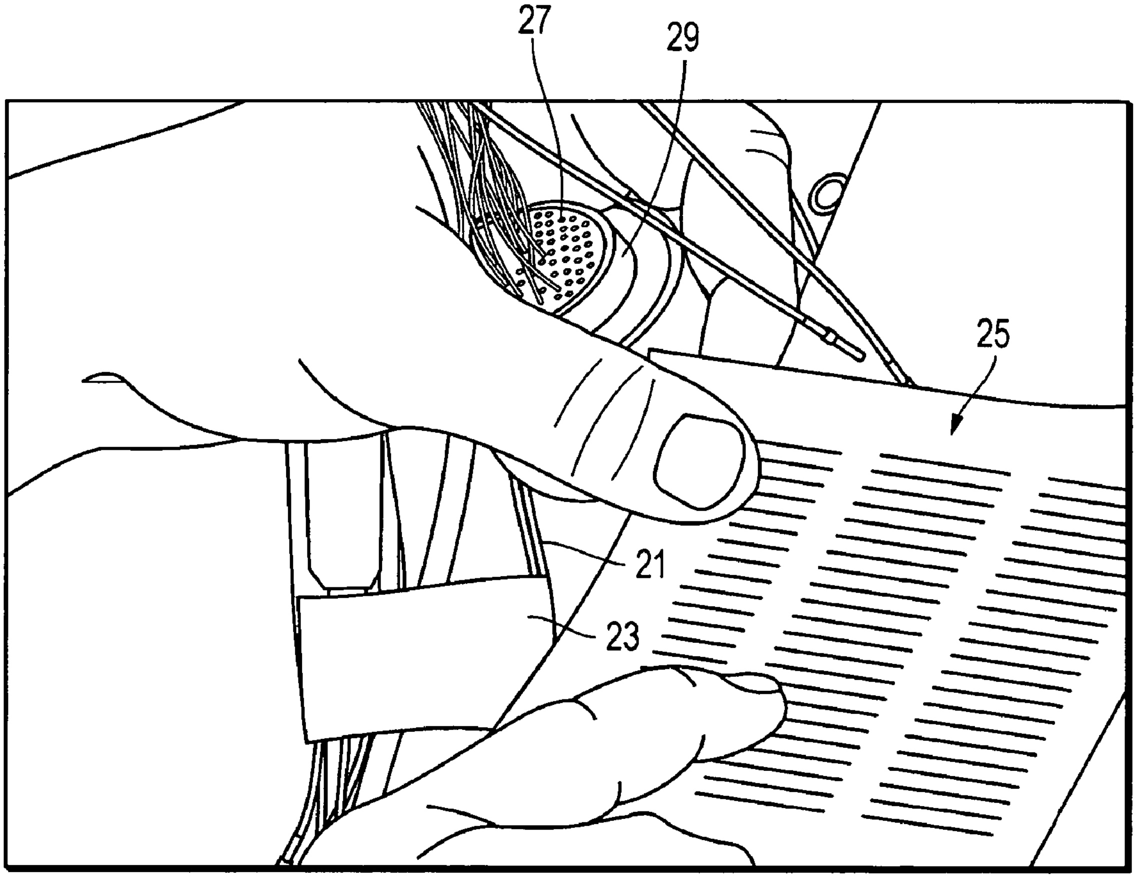
FIG. 1 (Prior Art)
FIG. 1 is an isometric view of one step in a conventional wire harness assembly method.
Figure 2:
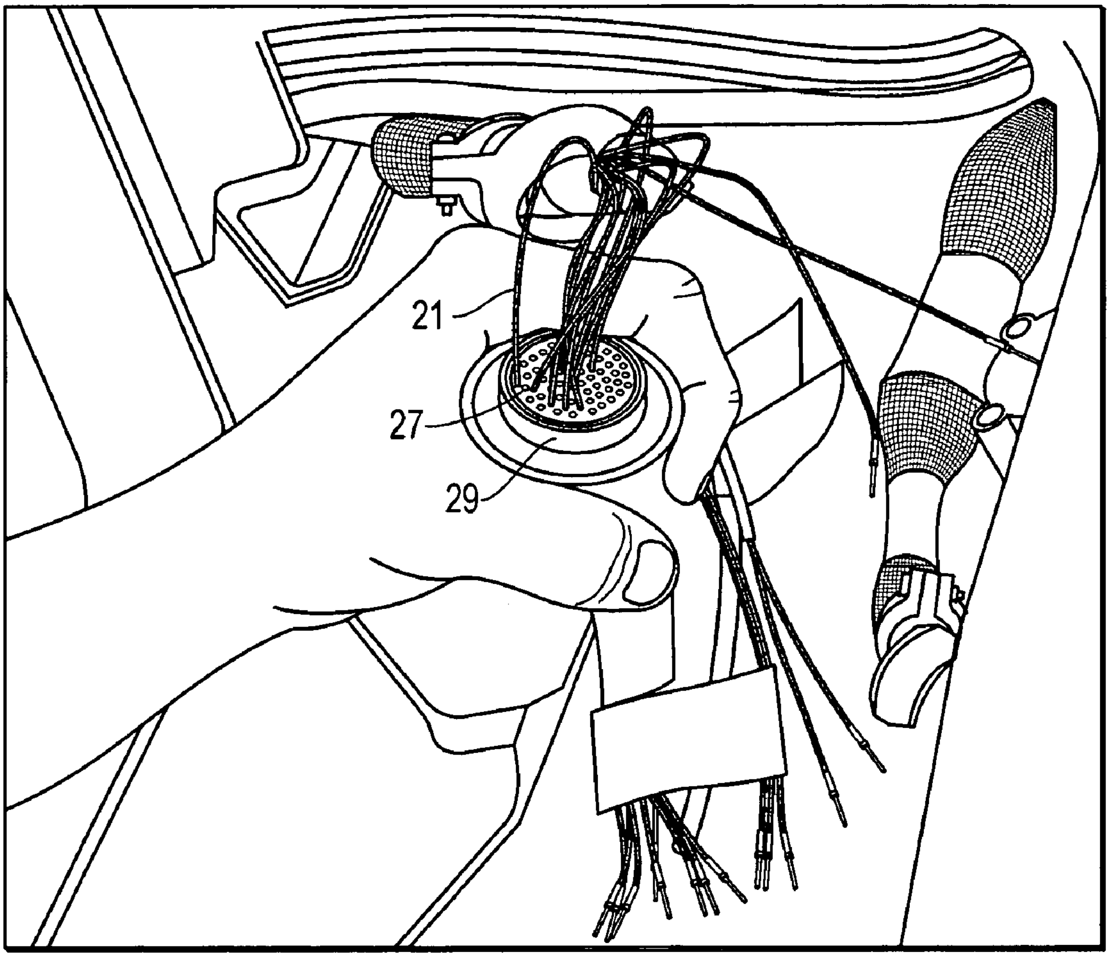
FIG. 2 (Prior Art)
FIG. 2 is an isometric view of another step in a conventional wire harness assembly method.
Figure 3:
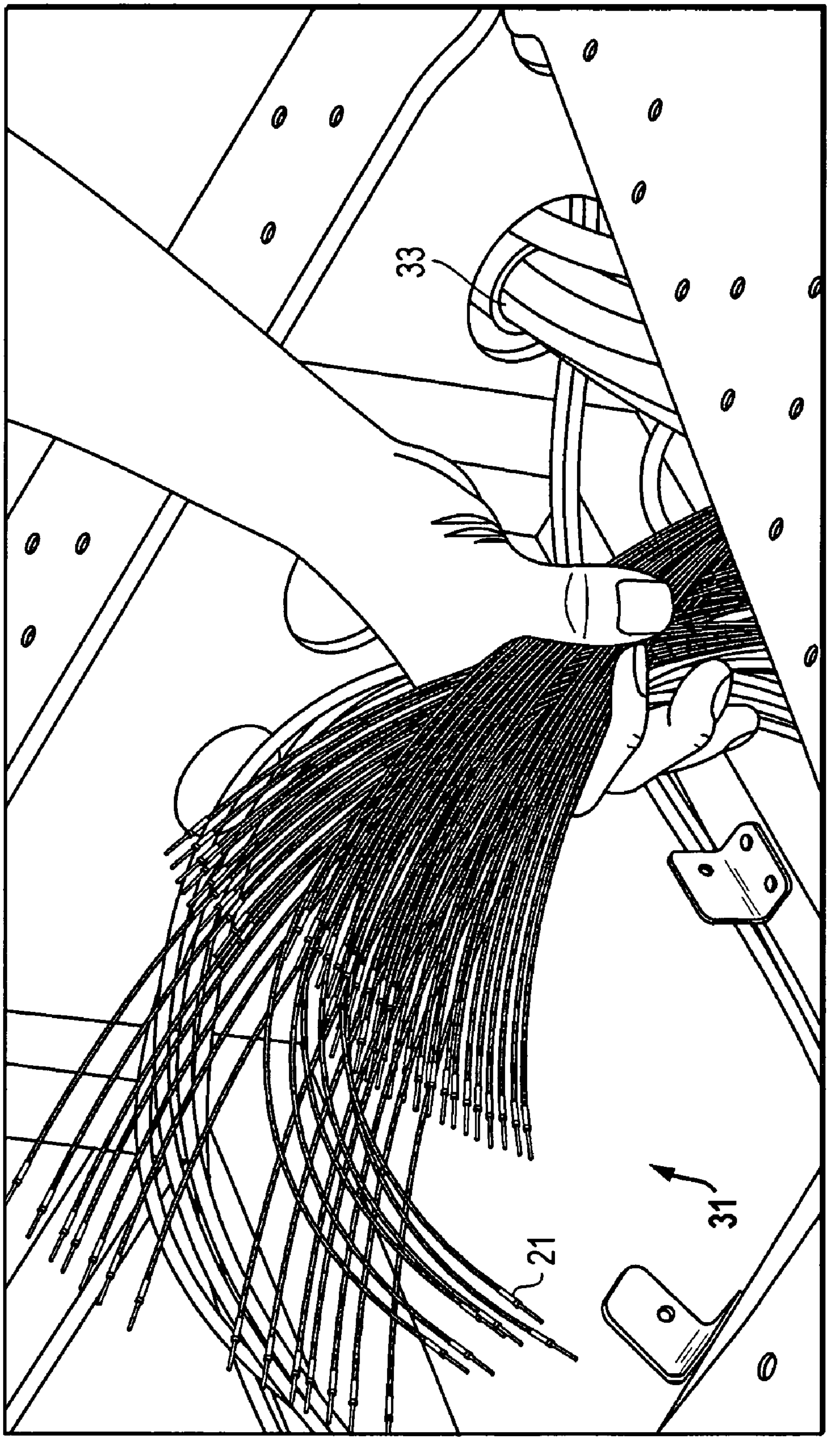
FIG. 3 (Prior Art)
FIG. 3 is an isometric view of a plurality of conventional wire harnesses in an assembly operation.
Figure 4:
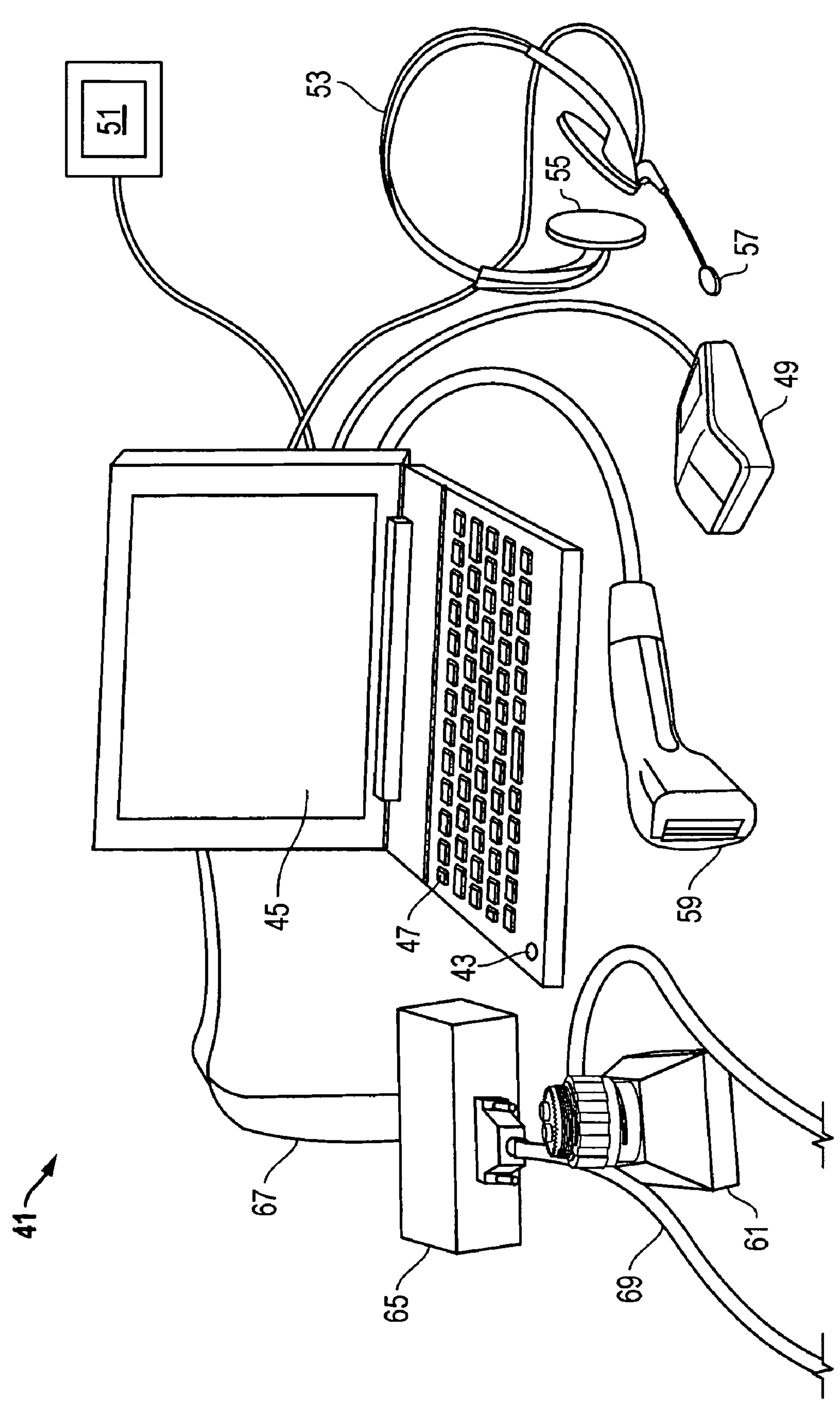
FIG. 4 is an isometric view of one embodiment of a system for wire harness assembly constructed in accordance with the present invention.
Figure 5A:
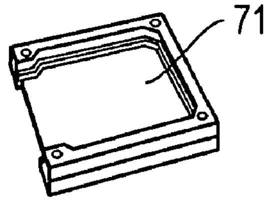
FIGS. 5(*a*)-5(*h*) are isometric views of one embodiment of a light array designator for the system of FIG. 4 shown at various stages of assembly.
Figure 5B:
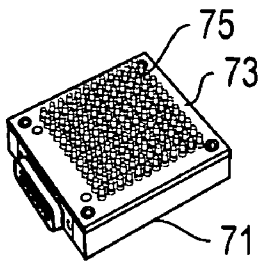
Figure 5C:
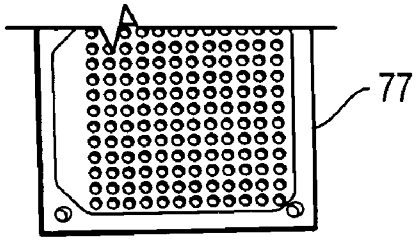
Figure 5D:
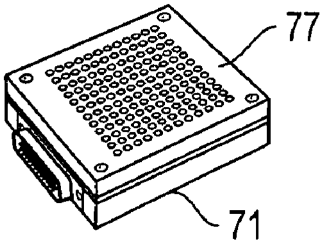
Figure 5E:
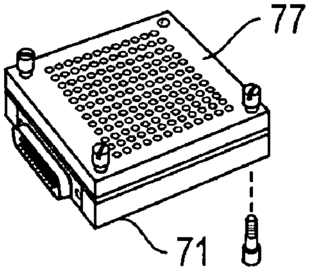
Figure 5F:
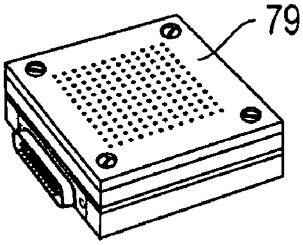
Figure 5G:
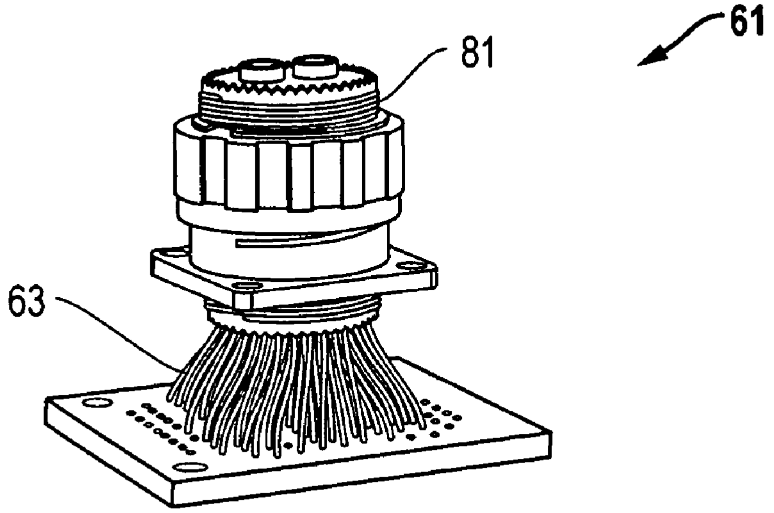
Figure 5H:
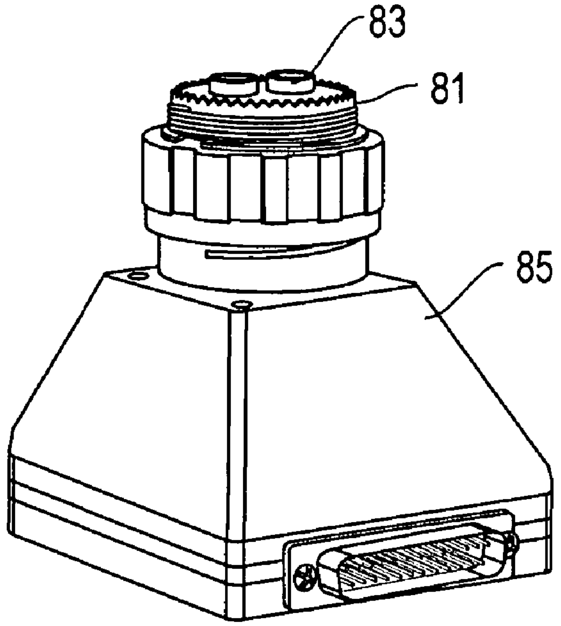

Referring to FIG. 4, one embodiment of a system 41, method, and apparatus for matching conductors with apertures in a connector is disclosed. The term "conductors" is used generically herein to refer to all types of conductors including but not limited to electrical and optical conductors, a single strand of wire, wires, and/or a cable of wires, etc. As described above and shown in FIGS. 1-3, the conductors 21 are usually bundled in groups or harnesses 31. A typical harness 31 may comprise only a few conductors 21 or more than 100 conductors 21. A typical connector 29 has many apertures 27 for receiving the terminal ends of the conductors 21.

The system 41 includes many different components, some of which are optional, as will be described below. Although many of these components are illustrated as being "hard-wired" to each other, they may utilize wireless technology as well. A main component of system 41 is a computer 43, such as the laptop computer shown. Computer 43 has a visual display 45 for displaying information to a user, and a keyboard 47 and a mouse 49 for manual entry of information by the user. A data base 51 is coupled to the computer 43 and has information regarding the harnesses 31, the conductors 21, and the connectors 29.

The system 41 has several alternative "reading means" that are coupled to the computer. The reading means are provided for inputting or reading information associated with individual ones of the conductors 21 and the various connectors 29. For example, keyboard 47 and mouse 49 may be used to manually enter the information and thereby to identify the conductors 21 and the connectors 29.

Alternatively, the reading means may comprise a head set 53 having speakers 55 and a microphone 57. When used with software and coupled to the computer 43, the head set 53 receives voice information from the user regarding the conductors 21 and the connectors 29 when read aloud by the user to identify them. Another alternative means for inputting information is a bar code reader 59 and software coupled to the computer for scanning information from the conductors 21 and the connectors 29 to identify them. The user also has the opportunity to select the input method for reading information from a list of options on the visual display 45 of the computer 43.

Figure 6:
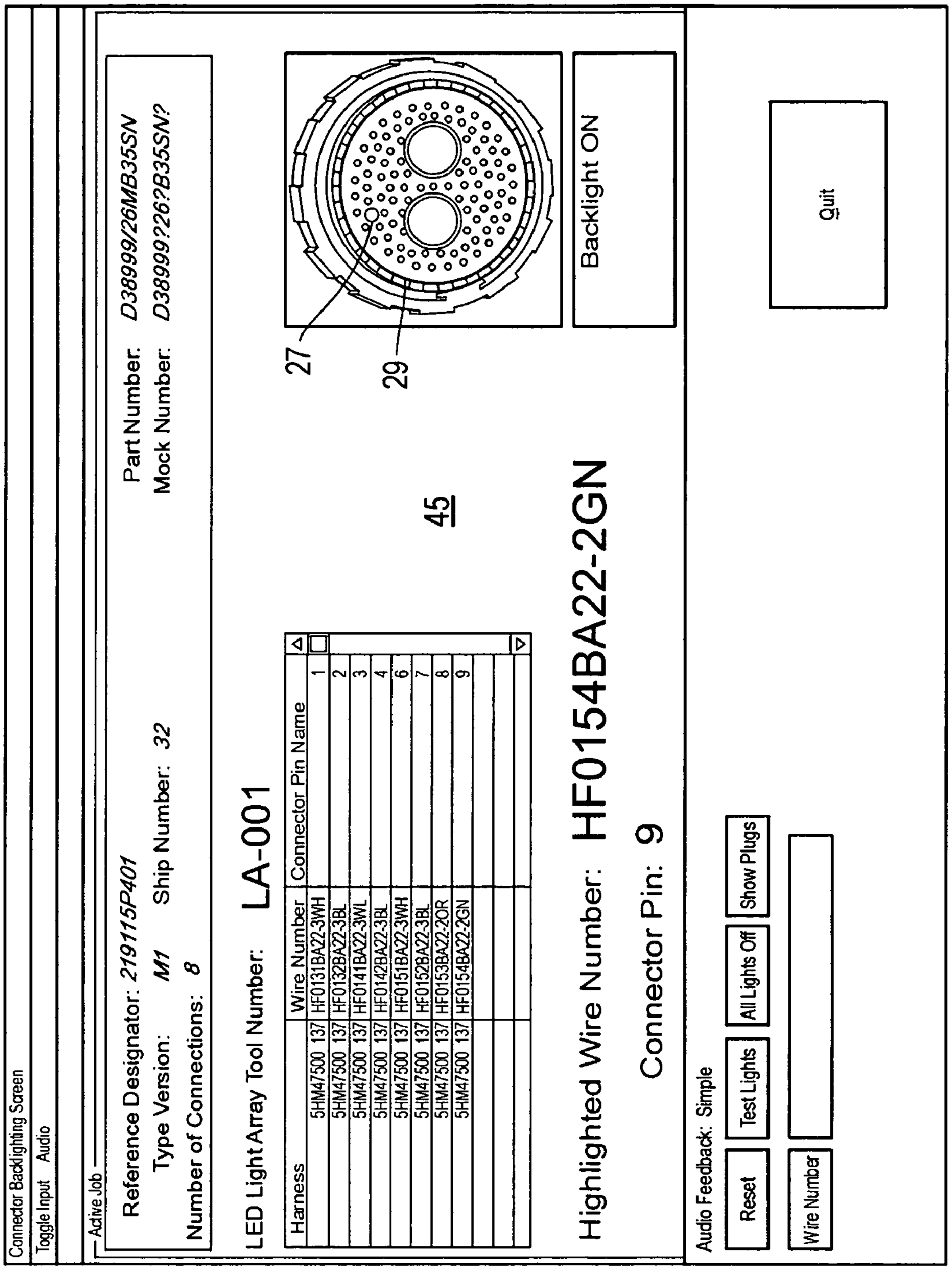
FIG. 6 is a schematic diagram of a diagnostic screen viewed by a technician while utilizing the system of FIG. 4.

The system 41 also comprises a designator or light array 61 that is coupled to the computer 43 and connectable to the selected connector 29. As shown in FIG. 5(*g*), the light array 61 has a plurality of light conductors 63 for illuminating individual ones of the apertures 27 in the connector 29 in response to commands from the computer 43 in order to designate to the user the aperture 27 in which each conductor 29 should be located. For example, as shown in FIG. 6, the visual display 45 of the computer 43 graphically illustrates a selected one of the apertures 27 in the connector 29 to indicate the aperture 27 in which a selected one of the conductors 21 should be inserted. In the embodiment shown, the light array 61 back-lights a selected one of the apertures 27 in the connector 29 in the same manner for the user to clearly define the aperture 27.

Light array 61 also utilizes an input/output expander circuit 65 that is coupled between the computer 43 and the light array 61. The input/output expander circuit 65 has a communication cable 67 extending to the computer 43, and a light cable 69 extending to the light array 61.

As shown in FIGS. 5(*a*) through 5(*h*), the light array 61 comprises a cover plate 71, an array of LEDs 75 mounted to a circuit board 73 on the cover plate 71, a separation plate 77 mounted to the cover plate 71 over the array of LEDs 75, a light rod guide plate 79 mounted to the separation plate 77, a mating connector 81 for coupling with the connector 29 and having a plurality of apertures 83, a light rod 63 extending between each of the apertures 83 in the mating connector 81 and each of the LEDs 75, and a covering 85 for integrating the components of the light array 61. The light rod guide plate 79 accommodates various diameters of light rods 63 so that many different types of connectors 29 can be used with system 41.

Figure 7:
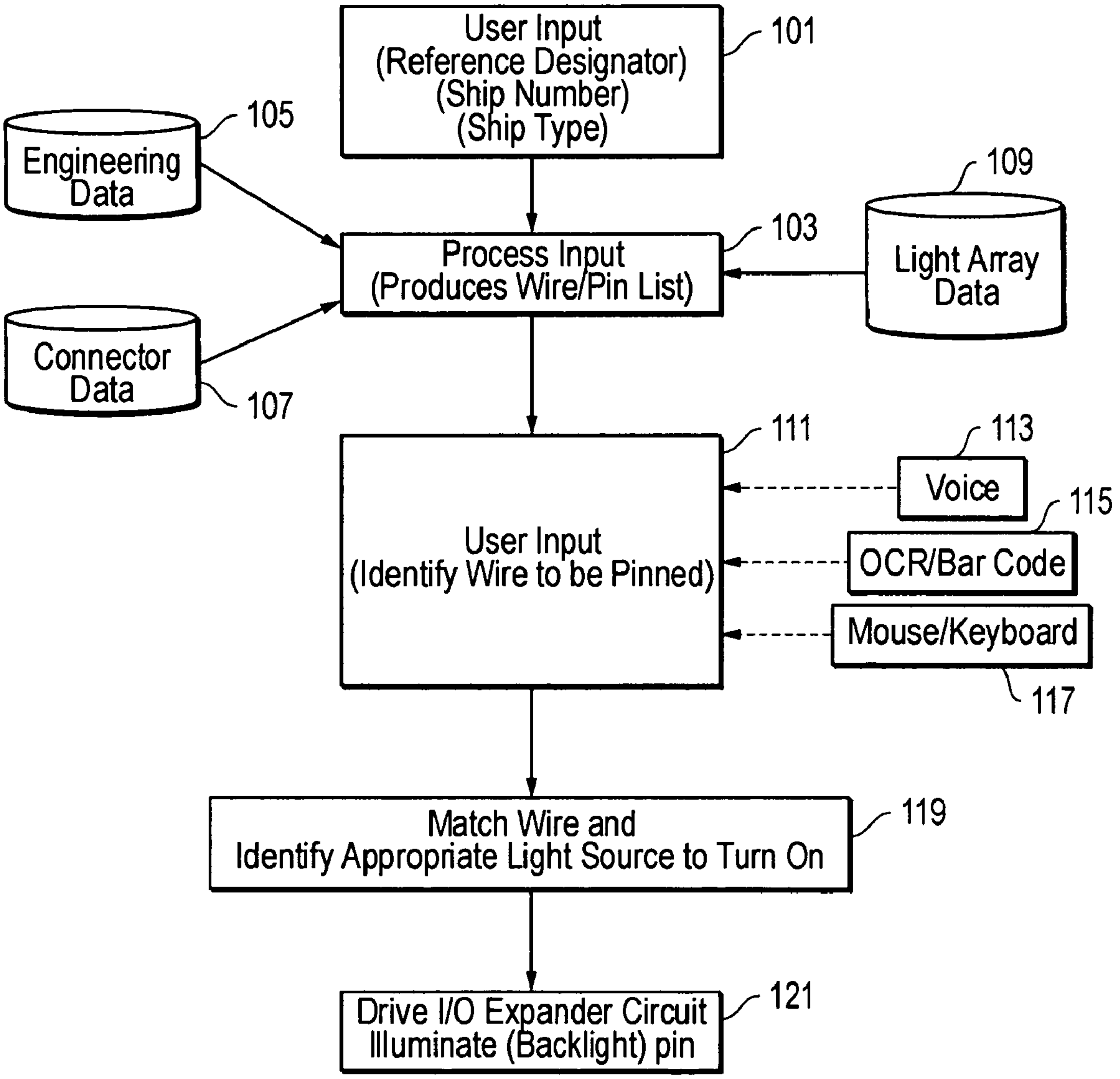
FIG. 7 is one embodiment of a data flow diagram for the system of FIG. 4.

Referring now to FIG. 7, one embodiment of a data flow diagram is shown which illustrates one embodiment of the above-described process. As depicted at block 101, the process is initiated with user input including a reference designator, ship number, and ship type. As illustrated at block 102, a wire/pin list is produced with process input, including user input 101, engineering data 105, connector data 107, and light array data 109. The user selects a wire to be pinned, as depicted at block 111, and enters information associated with the wire. The information may be input, for example, via voice (block 113), OCR or bar code (block 115), or manually by mouse or keyboard (block 117). As depicted at block 119, the computer then matches the wire with the appropriate aperture in the connector and identifies the aperture by turning on the appropriate light source (e.g., one of the LEDs). The drive input/output expander circuit then illuminates (backlights) the pin aperture, as illustrated at block 121.

The present invention also includes a method of matching a harness of conductors with apertures in a connector. In one embodiment, the method comprises providing a harness 31 having a plurality of conductors 21, and a connector 29 having a plurality of apertures 27 for receiving the conductors 21. The method further comprises selecting one of the conductors 21 and inputting information related to said one of the conductors 21 into a computer 43. The inputting step may comprise receiving voice information from a user regarding the conductors 21 when read aloud by the user to identify the conductors 21, scanning information (e.g., bar codes) from the conductors 21 to identify the conductors 21, and/or manual entry of information from the conductors 21 to identify the conductors 21. The method may further comprise allowing the user to select an input method for inputting information from the conductors 21.

The computer 43 displays the information and illuminates a corresponding one of the apertures 27 in the connector 29 via a command from the computer 43. In the embodiment, shown and described the illumination takes place by backlighting the apertures 27 in the connector 29. The user inserts said one of the conductors 21 into said corresponding one of the apertures 27, and then repeats these steps for another one of the conductors 21 until all of the conductors 21 in the harness 31 are terminated in their proper apertures 27 in the connector 29.

Figure 8:
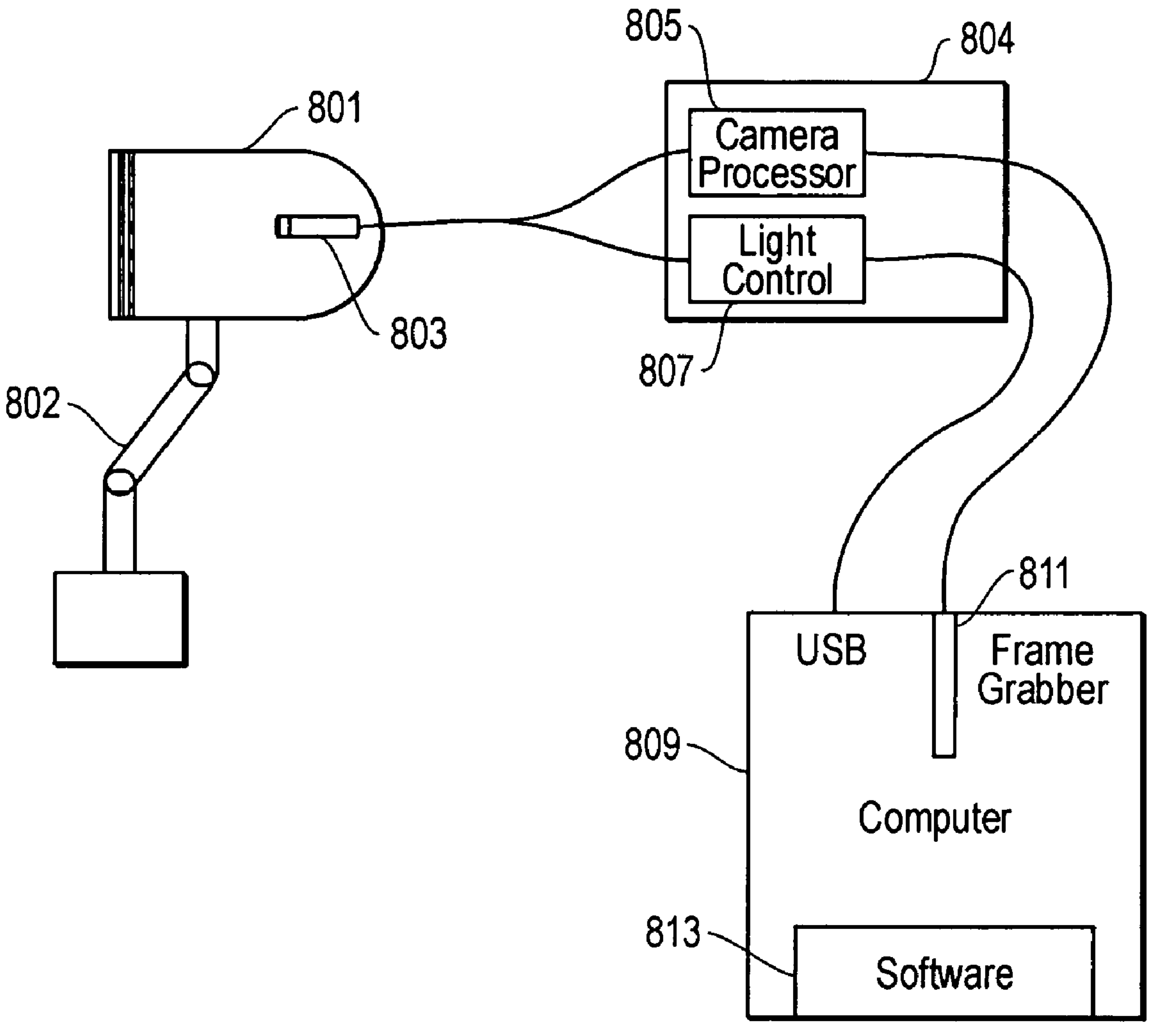
FIG. 8 is a schematic diagram of one embodiment of an OCR system constructed in accordance with the present invention.
Figure 9:
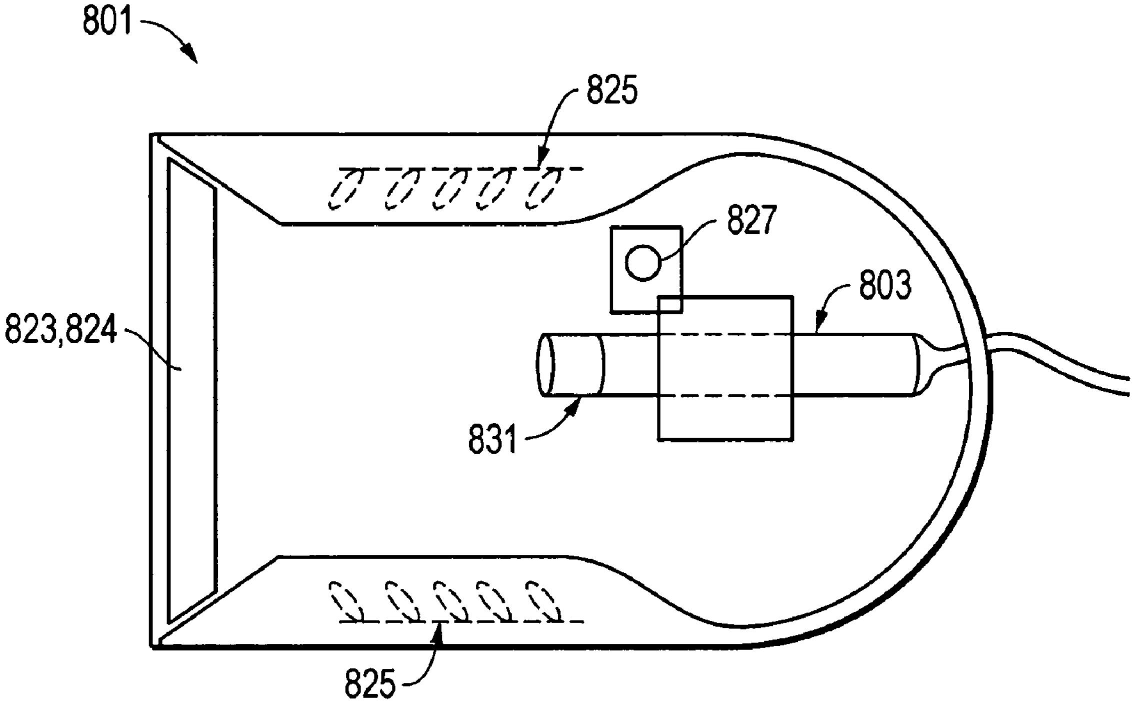
FIG. 9 is a sectional top view of one embodiment of reader head for the OCR system of FIG. 8 and is constructed in accordance with the present invention.
Figure 10:
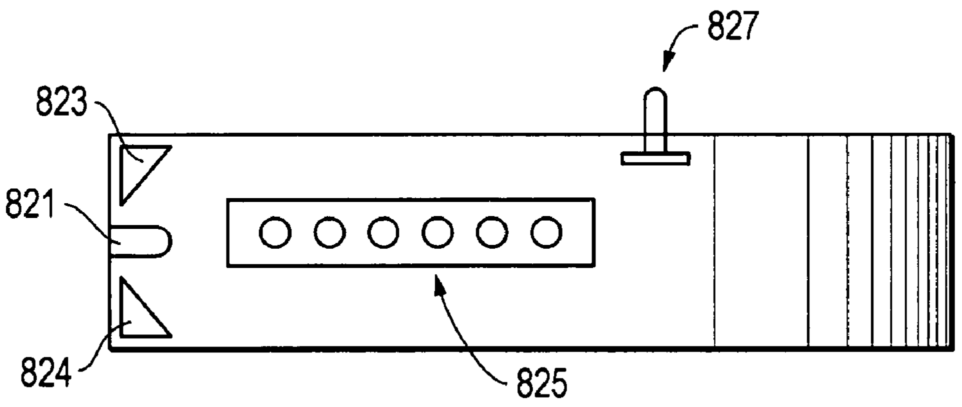
FIG. 10 is a partial sectional side view of the reader head of FIG. 9 and is constructed in accordance with the present invention.

Referring now to FIG. 8-10, one embodiment of an optical character recognition system constructed in accordance with the present invention is shown. The OCR system comprises a reader head 801 having a camera 803 for reading a label, character string, or the like on a workpiece (e.g., a conductor). The reader head 801 may be mounted to an adjustable fixture 802 for better positioning. An OCR interface box 804 is coupled to reader head 801 and contains a camera processor 805, and a light control 807. A computer 809 is coupled to box 804 including a frame grabber 811, and software 813 for processing images of the conductors and their labels and communicating information to the user.

As shown in FIGS. 9 and 10, the reader head 801 has a slot 821 for receiving a conductor, a pair of inclined mirrors 823, 824 mounted adjacent the slot 821 for reflecting images of the received conductor, and LEDs 825 for illuminating the received conductor. The OCR system displays an image of the received conductor (e.g., on display 45 in FIG. 4) composed from the received conductor and the two reflected images in the mirrors 823, 824.

In one embodiment, the upper mirror 823 is oriented at 50 degrees relative to the top of reader head 801, and the lower mirror 824 is oriented at 60 degrees relative to the bottom of reader head 801. The LEDs 825 are illustrated as two side banks of LEDs, each having six, 3 mm white LEDs. The LEDs 825 are soldered to a printed circuit board (PCB) that is secured to the reader head 801. The LEDs 825 are aimed across the camera path so as to provide as linear of a distribution of light as possible. The LEDs 825 are driven by light control 807.

The reader head 801 also may be equipped with a status light 827. Status light 827 may comprise a tri-color LED having, for example, blue, red, and green light capability. Depending on the status of an OCR attempt, one of these colors illuminates. For example, if status light 827 is blue, the conductor has been located and a datum established. If status light 827 is red, an OCR attempt has failed to find the wire number. If status light 827 is green, a wire number has been successfully identified. Status light 827 is soldered to a PCB that is mounted to reader head 801. In addition, a lens 831, such as a 4 mm focal length lens, may be affixed to camera 803.

In one embodiment, a three-color image of the conductor is acquired using the camera and frame grabber. The camera and framegrabber are set up using, for example, the YC method, also known as "S-Video, "Luminance-Chroma", and "Two Wire." Image size may be standard RS170, which is 640 by 480 (pixels). In one embodiment, there are two mirrors located in the reader head that are positioned such that, when the wire is inserted, the camera sees three wires, each showing a different view of the wire. The "center wire" is a head-on, direct view, while the wires above and below the center wire are mirror images. The upper mirror image shows a view that includes more of the top part of the wire, while the lower mirror image shows a view that includes more of the bottom part of the wire. This results in a radial inspection area of approximately 210 degrees.

The acquired image is split out to each of the three color components (e.g., red, green, blue (RGB)). The blue component may be used for edge detection of the wire edges. This is due to the lighting used (i.e., LEDs), and the blue component gives better edge information. The green component is used for the actual character search, and gives better contrast between the characters and the background wire.

Several steps may be used to find a number string on a single wire. For wire location and recognition, the blue component of the image may be binarized using a predetermined threshold value. Each color component is eight bits in depth, thus the range of values is between 0 and 255. The result is a binary image, one bit deep, so pixels are either black or white. Conventional software may be used to identify each wire edge. Each wire image consists of two edges. This is a standard edge detector, and in this case, a binary image is used, so more complex edge detector algorithms (e.g., Hough transform, derivative of Gaussian, etc.) is not necessary.

A chain code for each edge found is generated. Chain code is the name for the array of XY pixel locations that define the edge boundaries. The top and bottom images are flipped to correct for mirror reversal. Edges are paired up and arranged such that they are properly paired up to define a wire. The diameter of the wire sleeve is calculated using pixel location and calibration factors. For each of the three wire images, the location of the first character on the wire is found, and roll of the character is determined. For any given wire placement, one of the three views holds the best image for visibility of the characters. After all three wires are checked for roll, the best of the three is determined, and this view is used for the remaining OCR steps. The wire data is then loaded based on diameter.

The following steps may be performed regarding one embodiment of character recognition and wire number identification. For example, a list of candidate wires is obtained based on any characters thus far in a string. If there is only one wire remaining to be identified, the wire number has been found, so processing is stopped and the wire number is returned. Otherwise, the region of the candidate in the image to search in is computed and run against all models possible. Geometric model finder parameters are set, such as scale, angle, accuracy, and others. A conventional geometric model finder is used, and the best score of all possible candidates is determined to add the winning character to the wire number string based on the best score.

Figure 11:
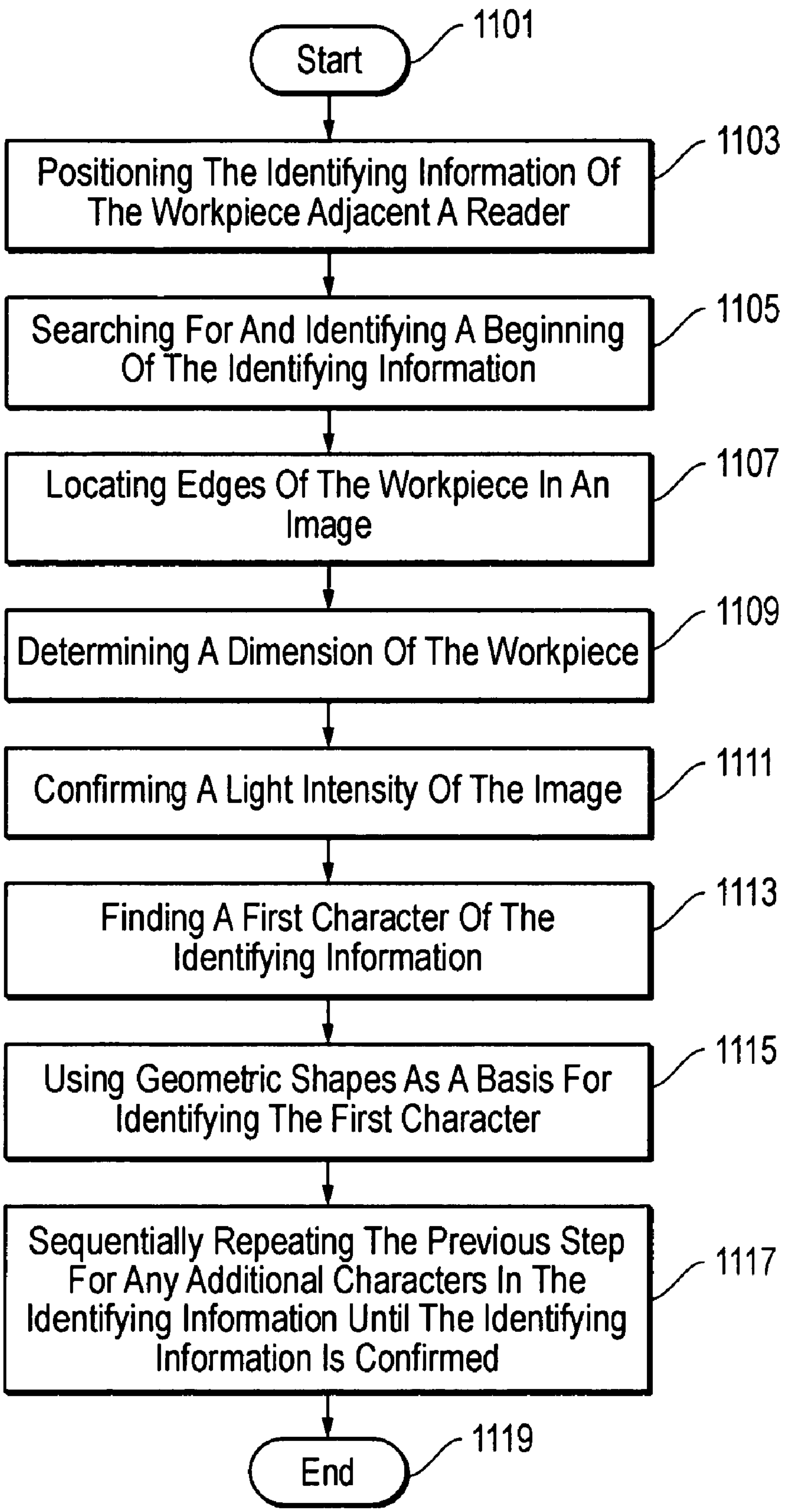
FIG. 11 is a high level flow diagram of one embodiment of a method constructed in accordance with the present invention.

Referring now to FIG. 11, one embodiment of a method utilized by software 813 and constructed in accordance with the present invention is shown. The method starts as indicated at step 1101, and comprises optical character recognition of identifying information on a workpiece. The method comprises positioning the identifying information of the workpiece adjacent a reader (step 1103); searching for and identifying a beginning of the identifying information (step 1105); locating edges of the workpiece in an image thereof (step 1107); determining a dimension of the workpiece (step 1109); confirming a light intensity of the image (step 1111); finding a first character of the identifying information (step 1113); using geometric shapes as a basis for identifying the first character (step 1115); and then sequentially repeating the using geometric shapes step for any additional characters in the identifying information until the identifying information is confirmed (step 1117); before ending as indicated at step 1119.

In another embodiment, step 1105 may comprise positioning the conductor information adjacent a reader; searching for and identifying a beginning of the conductor information; locating edges of the conductor in an image thereof; determining a diameter of the conductor; confirming a light intensity of the image; finding a first character of the conductor information; using geometric shapes as a basis for identifying the first character; and then sequentially repeating the using geometric shapes step for any additional characters in the conductor information until the conductor information is confirmed. Every character in the conductor information may be identified, and the conductor information may be identified character by character, and a search for a character may be restricted to an area surrounding the first character. The method may further comprise providing access to a conductor database including the conductor information; and comparing at least one of the identified characters in the conductor information to the conductor database.

The method also may further comprise checking characters for all possible characters that could be in each position based on the conductor database; identifying fewer than all of the characters in the conductor information when a unique component of the conductor information is confirmed; defining a character width based on a width of the first character, and limiting subsequent character searches to the character width; and/or searching for and identifying an XY location of the beginning of the conductor information.

The present invention has several advantages, including the ability to quickly and accurately assemble bundles of wires and connectors. The wires may be identified and pinned in a number or ways, including by voice recognition, bar code, or optical character recognition. The identifying information on the selected wire is read and thereby identify the selected wire by translating the information into a format that can be cross-checked against the engineering data.

The illuminated pin hole in the connector provides for very fast and accurate placement of the wires. The system can operate in confined areas, is portable in nature, and is easily maintained. In addition, the system is easy to learn, easy to use, and virtually error free. In contrast, prior art systems are so flexible, as they require larger open areas, or the attachment of a low voltage power source at the opposite end of the harness being pinned. The design of the present invention allows for it to be used by manufacturers or harness assemblers requiring much more remote and limited access, such as in the assembly of automobiles or aircraft.

While the invention has been shown or described in only some of its forms, it should be apparent to those skilled in the art that it is not so limited, but is susceptible to various changes without departing from the scope of the invention.

What is claimed is:

1. A method of matching a harness of conductors with apertures in a connector, the method comprising:

(a) providing a harness having a plurality of conductors, and a connector having a plurality of apertures for receiving the conductors;

(b) reading information from one of the conductors with OCR and inputting the information related to said one of the conductors into a computer;

(c) displaying information on the computer;

(d) illuminating a corresponding one of the apertures in the connector via a command from the computer;

(e) inserting said one of the conductors into said corresponding one of the apertures; and then (f) repeating steps (b) through (e) for another one of the conductors until all of the conductors are terminated in the connector.

2. A method according to claim 1, wherein step (b) comprises positioning the conductor information adjacent a reader;

searching for and identifying a beginning of the conductor information;

locating edges of the conductor in an image thereof;

determining a diameter of the conductor;

confirming a light intensity of the image;

finding a first character of the conductor information;

using geometric shapes as a basis for identifying the first character; and then sequentially repeating the using geometric shapes step for any additional characters in the conductor information until the conductor information is confirmed.

3. A method according to claim 1, wherein every character in the conductor information is identified.

4. A method according to claim 1, further comprising providing access to a conductor database including the conductor information; and comparing at least one of the identified characters in the conductor information to the conductor database.

5. A method according to claim 4, further comprising checking characters for all possible characters that could be in each position based on the conductor database.

6. A method according to claim 4, further comprising identifying fewer than all of the characters in the conductor information when a unique component of the conductor information is confirmed.

7. A method according to claim 2, wherein the conductor information is identified character by character, and a search for a character is restricted to an area surrounding the first character.

8. A method according to claim 2, further comprising defining a character width based on a width of the first character, and limiting subsequent character searches to the character width.

9. A method according to claim 2, further comprising searching for and identifying an XY location of the beginning of the conductor information.

* * * * *

UNITED STATES PATENT AND TRADEMARK OFFICE

CERTIFICATE OF CORRECTION

PATENT NO. : 7,647,695 B2
APPLICATION NO. : 11/149836
DATED : January 19, 2010
INVENTOR(S) : MacNutt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1258 days.

Signed and Sealed this

Sixteenth Day of November, 2010

David J. Kappos
*Director of the United States Patent and Trademark Office*